United States Patent
Sun

(10) Patent No.: US 11,245,323 B2
(45) Date of Patent: Feb. 8, 2022

(54) MULTI-PHASE POWER SUPPLY DYNAMIC RESPONSE CONTROL CIRCUIT AND CONTROL METHOD

(71) Applicant: Shanghai Bright Power Semiconductor Co., Ltd., Shanghai (CN)

(72) Inventor: Shun-Gen Sun, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 17/356,737

(22) Filed: Jun. 24, 2021

(65) Prior Publication Data

US 2021/0408890 A1 Dec. 30, 2021

(30) Foreign Application Priority Data

Jun. 30, 2020 (CN) .......................... 202010617864.3

(51) Int. Cl.
*H02M 1/00* (2006.01)
*H03K 7/08* (2006.01)

(52) U.S. Cl.
CPC ............ *H02M 1/0019* (2021.05); *H03K 7/08* (2013.01)

(58) Field of Classification Search
CPC ................................ H02M 1/0019; H03K 7/08
USPC ........................................................ 327/175
See application file for complete search history.

(56) References Cited

U.S. PATENT DOCUMENTS

| | | | | |
|---|---|---|---|---|
| 7,109,689 B2* | 9/2006 | Schneider | ........... | H02M 3/1584 323/272 |
| 8,030,908 B2* | 10/2011 | Huang | ............... | H02M 3/1584 323/237 |
| 8,232,782 B2* | 7/2012 | Houston | ............ | H04L 25/4902 323/272 |
| 10,498,237 B1* | 12/2019 | Lin | ....................... | H02M 3/158 |
| 2011/0241640 A1* | 10/2011 | Qiu | ..................... | H02M 3/1584 323/283 |
| 2011/0289335 A1* | 11/2011 | Lipiansky | ............. | H02M 3/158 713/340 |
| 2016/0126837 A1* | 5/2016 | Tschirhart | ........... | H02M 3/1584 323/271 |
| 2021/0119532 A1* | 4/2021 | Zou | ..................... | H02M 1/0025 |

* cited by examiner

*Primary Examiner* — Tomi Skibinski
(74) *Attorney, Agent, or Firm* — Muncy, Geissler, Olds & Lowe, P.C.

(57) ABSTRACT

The present invention discloses a multi-phase power supply dynamic response control circuit and a control method. When a rapid rise of the load is detected, an output PWM signal is temporarily adjusted to enter a second operation mode from a first operation mode to supplement energy to the load and prevent the output voltage from decreasing. The present invention requires little modification to the existing circuit, and adopts simple, explicit and efficient detection method, realizing rapid dynamic response by providing sufficient energy for the load when the load current is suddenly increased.

16 Claims, 4 Drawing Sheets

MULTI-PHASE POWER SUPPLY DYNAMIC RESPONSE CONTROL CIRCUIT AND CONTROL METHOD

FIELD OF THE INVENTION

The disclosure relates to the technical field of electronic circuits, in particular to a multi-phase power supply dynamic response control circuit and a control method capable of realizing a multi-phase power supply dynamic response optimization mechanism.

BACKGROUND OF THE INVENTION

In high-current or high-power applications, multi-phase parallel power supply is generally adopted, and PWM (Pulse Width Modulation) signals controlling different power phases can be synchronized or staggered by a certain phase. The multi-phase power supply control circuit consists of a multi-phase controller and multiple power processors (Powerstage IC or DrMOS). To optimize efficiency, auto-phase regulating (also known as auto-phase shedding) is often required. In a phase shedding mode, the multi-phase power supply control circuit determines the number of power processors performing power operation according to the magnitude of load current. When the load current is low, only part of the power processors in the multi-phase power supply control circuit performs power operation.

The existing multi-phase power supply control circuit mainly comprises: a multi-phase controller and a plurality of power processors. The multi-phase controller provides a corresponding number of PWM signals based on a load current to respectively control each power processor; the power processors are connected in parallel for providing an output voltage to the load. Since constant on time (COT) control method has fast dynamic response and good light load efficiency, a multi-phase power supply usually adopts this control method. Adopting a constant on time control method, the on time Ton_s of each phase is fixed or approximately fixed when input voltage and output voltage are fixed. Here the term "approximately fixed" means that the on time may vary slightly, e.g. in the frequency jitter mode. The on time Ton_s is consistent with the on time Ton_s at a steady state even when the load changes rapidly.

Through adopting the constant on time control method, when the load changes very quickly (i.e. when the load current surges), the response speed of the multi-phase power supply control circuit is not fast enough, the multi-phase power supply control circuit cannot respond to the change of the load in time, and a large undershoot on the output voltage occurs.

SUMMARY OF THE INVENTION

Aiming at the technical problems in the prior art, the disclosure provides a multi-phase power supply dynamic response control circuit and a control method, which can temporarily adjust PWM signals to supply more energy to the load when the load current is sharply increased and prevent the output voltage from decreasing.

To achieve the object, the disclosure provides a multi-phase power supply dynamic response control circuit, comprising: a multi-phase controller for providing a plurality of PWM signals based on load current, a plurality of power processors connected in parallel and configured to be conducted in response to a corresponding one of the plurality of PWM signals to jointly supply energy to the load, wherein the multi-phase controller is further configured to adjust the plurality of PWM signals to enter a second operation mode from a first operation mode if a rapid rise in the load current is detected.

To achieve the object, the disclosure also provides a multi-phase power supply dynamic response control method using the multi-phase power supply dynamic response control circuit of the disclosure, the method comprising the steps of providing a plurality of PWM signals based on the load current through the multi-phase controller to determine a number of power processors which jointly supply energy to a load; detecting whether a rapid rise in the load current occurs or not; and if the rapid rise in the load current is detected, adjusting the plurality of PWM signals by the multi-phase controller to enter a second operation mode from a first operation mode.

The disclosure has the advantages that when a rapid increase of the load is detected, the output PWM signal is temporarily adjusted to enter the second operation mode from the first operation mode to supplement energy to the load and prevent the output voltage from decreasing. The disclosure requires little modification to the existing circuit, and adopts simple, explicit and efficient detection method, realizing rapid dynamic response by providing sufficient energy for the load when the load current is suddenly increased.

DETAILED DESCRIPTION OF THE PREFERRED EMBODIMENTS

Figure 1:
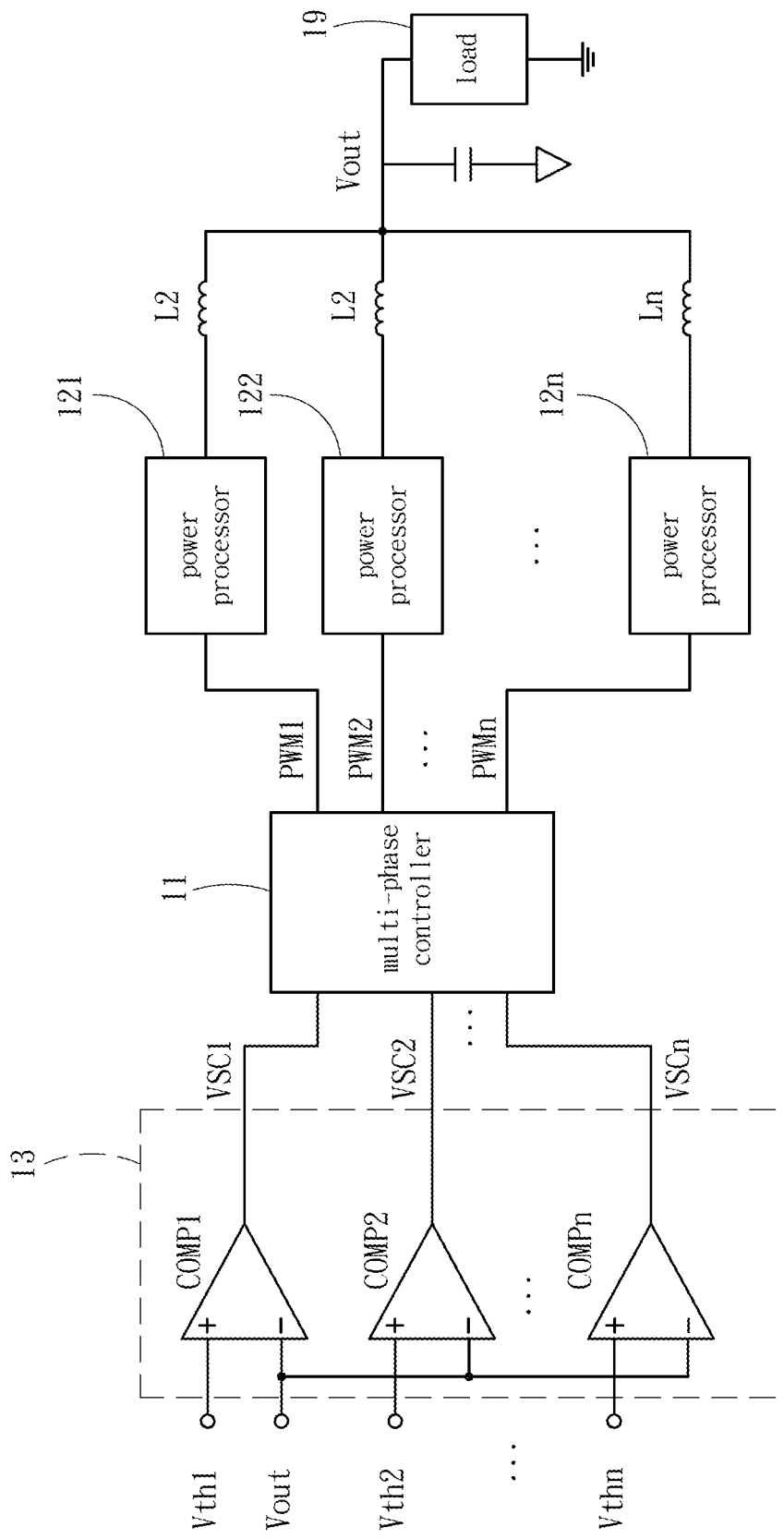
FIG. 1 is a circuit diagram of an embodiment of a multi-phase power supply dynamic response control circuit of the present disclosure.

The embodiments of the present disclosure will now be described more clearly and fully hereinafter with reference to the accompanying drawings. It is to be understood that the described embodiments are only a few, but not all, embodiments of the disclosure. Based on the embodiments of the present disclosure, all other embodiments obtained by a person skilled in the art without involving any inventive effort are within the scope of protection of the present disclosure. The terms "first", "second", "third", and the like in the description and claims of the disclosure and in the drawings, if any, are used for distinguishing between similar objects and not necessarily for describing a particular order or sequential order. It should be understood that the objects so described are interchangeable under appropriate circumstances. Furthermore, the terms "comprising", "having", and any variations thereof are intended to cover a non-exclusive inclusion. In the description of the present disclosure, the meaning of "a plurality" is two or more unless specifically defined otherwise.

In describing the present disclosure, it is to be understood that the term "connected with" and "connected to" are to be interpreted broadly unless explicitly stated and defined otherwise. For example, they can be electrically connected or in communication with one another, they can be directly connected, they can be indirectly connected through an intermediary, they can be in communication within two elements, or they can be in interacting relationship with one another. It will be understood that when an element is referred to as being "coupled" to another element, there are intervening elements. The specific meaning of the terms in the present disclosure will be understood by those of ordinary skill in the as the case may be.

The disclosure provides a multi-phase power supply dynamic response control circuit which is used for supplementing energy to the load by temporarily adjusting PWM signals to enter the second operation mode from the first operation mode, so as to prevent the output voltage from decreasing when the load current is sharply increased. The on time of at least one of the power processors in the second operation mode is greater than the on time of at least one of the power processors in the first operation mode. In the second operation mode, the pulse width of the PWM signal (i.e., the on time of the power processor) may change according to a change in load current. The disclosure can solve the problem that the existing multi-phase power supply control circuit adopting the COT mode cannot respond to the change of the load in time very quickly, so that a large undershoot appears on the output voltage. In addition, the disclosure requires little modification to the existing circuit, and adopts simple, explicit and efficient detection method, realizing rapid dynamic response by providing sufficient energy for the load when the load current is suddenly increased.

Figure 2:
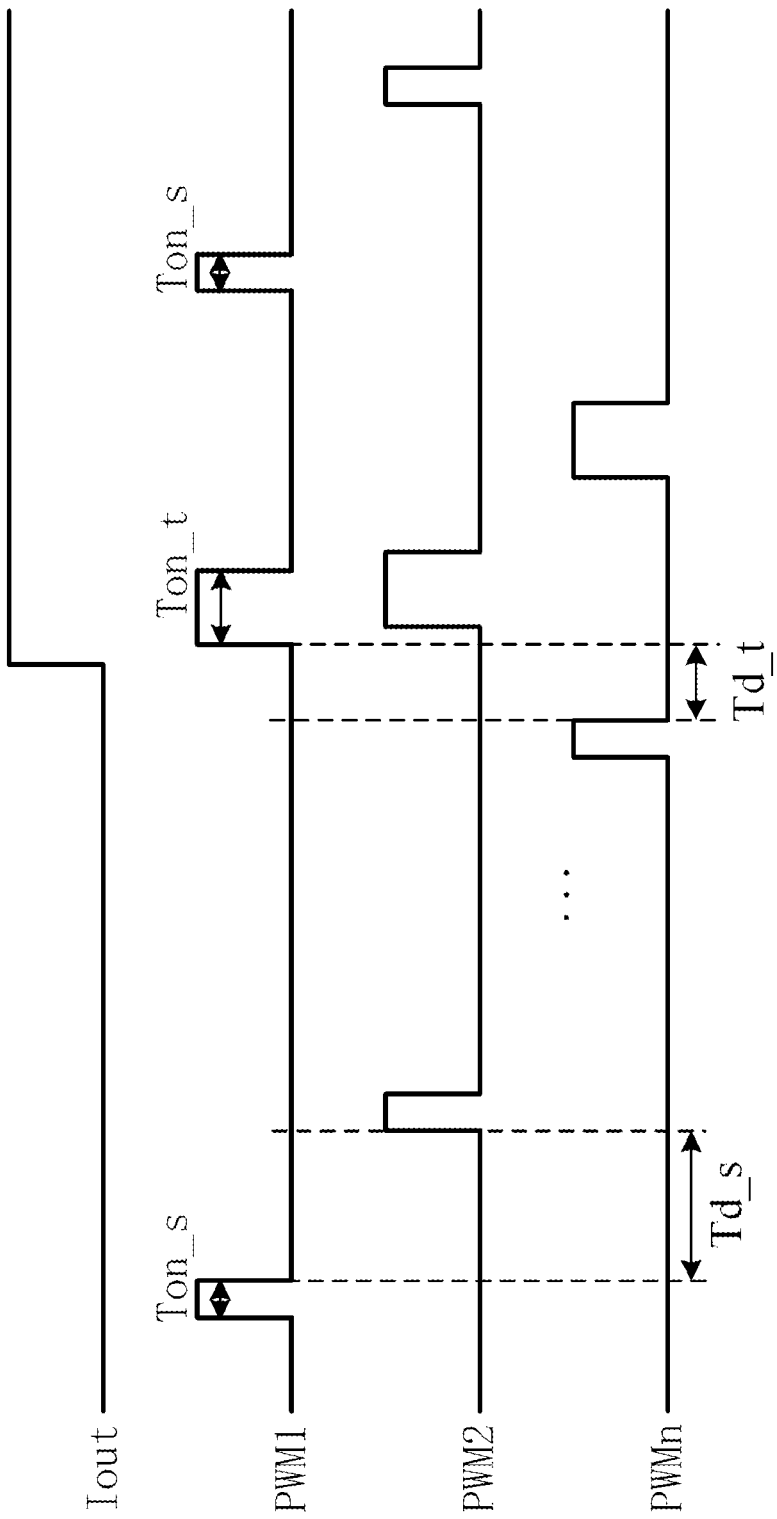
FIG. 2 is a waveform diagram of the PWM signals of the present disclosure.

With reference to FIGS. 1 and 2, FIG. 1 is a circuit diagram of an embodiment of a multi-phase power supply dynamic response control circuit of the present disclosure, and FIG. 2 is a waveform diagram of a PWM signal of the present disclosure.

As shown in FIG. 1, the multi-phase power supply dynamic response control circuit 10 comprises a multi-phase controller 11 and a plurality of power processors 121-12n. The plurality of power processors 121-12n are connected in parallel, and coupled between the multi-phase controller 11 and the load 19. The multi-phase controller 11 is adapted to provide a corresponding number of PWM signals (PWM1-PWMn) based on the load current to control the power processors 121-12n, respectively. The plurality of power processors 121-12n are connected in parallel and coupled between the multi-phase controller 11 and the load 19 for being conducted in response to the corresponding PWM signals to jointly provide power to the load 19 (i.e., to provide a corresponding output voltage Vout to the load 19). Each power processor 121-12n is further connected in series with an inductor L1-Ln and then connected to the load 19. The multi-phase controller 11 is further configured to adjust the output PWM signals to enter a second operation mode from a first operation mode when a rapid rise in the load current Iout is detected.

The first operation mode is a COT (Constant On Time) mode, and the second operation mode is a COT mode with an increased on time. That is, the on time of the power processors 121-12n in the second operation mode is longer than the on time of the power processors 121-12n in the first operation mode. In the steady state of the load current Iout, the multi-phase controller 11 uses the COT mode to control the on time Ton_s of each of the power processors 121-12n supplying power to the load. The COT mode has fast dynamic response and good efficiency in light load. Under fixed input voltage and output voltage, the on time Ton_s of each phase is fixed or approximately fixed. Here the term "approximately fixed" means that the on time may vary slightly, e.g. in the jitter mode, the on time varies slightly.

In a further embodiment, in the second operation mode, the pulse width of the PWM signal changes according to the change of the load 19. For example, the on time Ton_s of the power processors 121-12n in the second operation mode is increased by adjusting the pulse width of the output PWM signal. The on time after the increase is recorded as Ton_t, where Ton_t>Ton_s. The wider the pulse width of the PWM signal is, the longer the on time Ton_t of the corresponding power processor 121-12n is increased.

In other embodiments, the multi-phase controller 11 may also adjust the frequency of the output PWM signal (i.e., the switching frequency of switching elements within the power processor) when a rapid rise in the load current Iout is detected. Specifically, the frequency of the output PWM signal is increased. Alternatively, the multi-phase controller 11 simultaneously adjusts the pulse width of the output PWM signal and the frequency of the output PWM signal when detecting the rapid rise in the load current Iout. That is, the on time and switching frequency are adjusted simultaneously to provide sufficient energy to the load. It should be noted that the multi-phase controller 11 operates reversely when a rapid decrease in the load current Iout is detected. That is, the on time is reduced by reducing the pulse width of the output PWM signal, and/or the switching frequency is decreased by reducing the frequency of the output PWM signal.

As shown in FIG. 2, when the rapid rise in the load current Iout is detected, the pulse width of the PWM signal is selected to be increased, and the on time of all the power processors 121-12n which supply energy to the load jointly is changed from Ton_s to Ton_t, where Ton_t>Ton_s. After a preset number of cycles, the pulse width of the PWM signal is reduced so that the on time can return to Ton_s, i.e. reenter the first operation mode. In the figure, Ton_s is the pulse width (i.e. Ton_steady) of the PWM signal at the steady state of the load current Iout. Ton_t is the pulse width of the PWM signal after the on time is increased. Td_s is the delay time (i.e. Td_steady) between the falling edge of the PWM signal at a current phase and the rising edge of the PWM signal in a next phase. Td_t is the delay time (i.e., Td_transient) between the falling edge of the PWM signal in a last phase in first operation mode and the rising edge of the PWM signal in a first phase in second operation mode. In FIG. 2, the frequency of the output PWM signal is also adjusted accordingly. Specifically, in a preset time period, the number of the rising edges of the PWM signals in each phase is increased (the time difference between the rising edges of the PWM signals in the same phase is shortened). During the preset time period, the number of the rising edges of the PWM signals in all phases also increases (the time difference between the rising edges of PWM signals in adjacent phases becomes shorter).

When rapid change of load is detected, the on time of each phase is increased and/or the switching frequency is increased, enough energy is provided for the load, and the output voltage can be prevented from decreasing.

In a further embodiment, in the second operation mode, the pulse width of the PWM signal, i.e. the difference between Ton_t and Ton_s, changes according to the change of the load 19. Specifically, the greater the increase in the load 19 is, the wider is the pulse width of the PWM signal (i.e., the longer the on time Ton_s), thereby providing sufficient energy to the load to prevent the output voltage from decreasing. The frequency of the output PWM signal can also change according to the change of the load 19. Specifically, the greater the increase in the load 19 is, the higher is the frequency of the output PWM signal, thereby providing sufficient energy to the load to prevent the output voltage from decreasing.

In a further embodiment, after a preset period, the multi-phase controller 11 adjusts the output PWM signal to reenter the first operation mode (i.e. to the COT mode when the load current is recovered to a steady state Iout). In particular, each phase may be selected to temporarily adjust the output PWM signal (i.e., to change Ton_s to Ton_t) for 1 or N cycles, typically N<=20. After N cycles have passed, the on time may return to the preset constant on time of the steady state (i.e., return from Ton_t to Ton_s).

In a further embodiment, the circuit 10 further comprises an output voltage comparison unit 13 (the dashed box indicates that this is optional). The output voltage comparison unit 13 is used for comparing the real-time output voltage Vout of the circuit 10 with at least one threshold voltage (Vthreshold, hereinafter referred to as Vth) to generate at least one voltage comparison signal VCS to be output to the multi-phase controller 11. The multi-phase controller 11 further determines whether the rapid rise in the load current Iout occurs according to the voltage comparison signal VCS. If the voltage comparison signal VCS is a preset level, it is determined that the rapid rise in the load current Iout occurs.

In a further embodiment, the output voltage comparison unit 13 is further configured to compare the real-time output voltage Vout of the circuit 10 with a plurality of threshold voltages Vth1-Vthn, respectively, to generate a plurality of voltage comparison signals VCS1-VCSn to be output to the multi-phase controller 11. The multi-phase controller 11 further determines whether the rapid rise in the load current Iout occurs or not. According to all the voltage comparison signals VCS1-VCSn, the multi-phase controller 11 adjusts the pulse width of the output PWM signal according a maximum change amount Vva_max of the output voltage when it is determined that the rapid rise in the load current Iout occurs. Here, the maximum change amount Vva_max of the output voltage is a difference between the output voltage Vout_steady of the circuit 10 when the load current Iout is at steady state and a minimum threshold voltage Vth_min to which the real-time output voltage Vout of the circuit 10 decreases, that is, Vva_max=Vout_steady−Vth_min. If the real-time output voltage Vout of the circuit 10 decreases to the threshold voltage Vthn (i.e. Vout=Vthn), the corresponding minimum threshold voltage Vth_min is the threshold voltage Vthn. If the real-time output voltage Vout of the circuit 10 decreases between the threshold voltage Vthi and the threshold voltage Vth (i+1) (i.e. Vth (i+1) >Vout>Vthi), the corresponding minimum threshold voltage Vth_min is the threshold voltage Vthi. For example, if the real-time output voltage Vout of the circuit 10 decreases to the threshold voltage Vth3 (i.e. Vout=Vth3), the corresponding minimum threshold voltage Vth_min is the threshold voltage Vth3. If the real-time output voltage Vout of the circuit 10 decreases between the threshold voltage Vth2 and the threshold voltage Vth3 (i.e. Vth3>Vout>Vth2), the corresponding minimum threshold voltage Vth_min is the threshold voltage Vth2.

When the multi-phase controller 11 determines that the rapid rise in the load current Iout occurs, the frequency of the output PWM signal can be adjusted according to the maximum change amount Vva_max of the output voltage. Specifically, the larger the maximum change amount Vva_max of the output voltage is, the higher is the frequency of the output PWM signal. Alternatively, the multi-phase controller 11 simultaneously adjusts the pulse width of the output PWM signal and adjusts the frequency of the output PWM signal according to the maximum change amount Vva_max of the output voltage when it is determined that that the rapid rise in the load current Iout occurs. That is, the on time and switching frequency are adjusted simultaneously to provide sufficient energy to the load.

Specifically, in the embodiment, the output voltage comparison unit 13 comprises a plurality of voltage comparators COMP1-COMPn. A positive input of each voltage comparator COMP1-COMPn receives a threshold voltage, i.e. Vth1-Vthn. A negative input of each voltage comparator COMP1-COMPn receives the real-time output voltage Vout of the circuit 10. The output of each voltage comparator COMP1-COMPn outputs voltage comparison signals VCS1-VCSn. According to the operation principle of the voltage comparator, if the voltage at the positive input is higher than that of the negative input, a high voltage level is output, and vise versa. In the embodiment, when the real-time output voltage Vout of the circuit 10 decreases below a certain threshold voltage, the respective voltage comparator COMPi outputs a high level. The multi-phase controller 11 may perform a corresponding logic operation based on voltage comparison signals received from all voltage comparators COMP1-COMPn to determine the minimum threshold voltage Vth_min that the real-time output voltage Vout of the circuit 10 decreases to.

Figure 3:
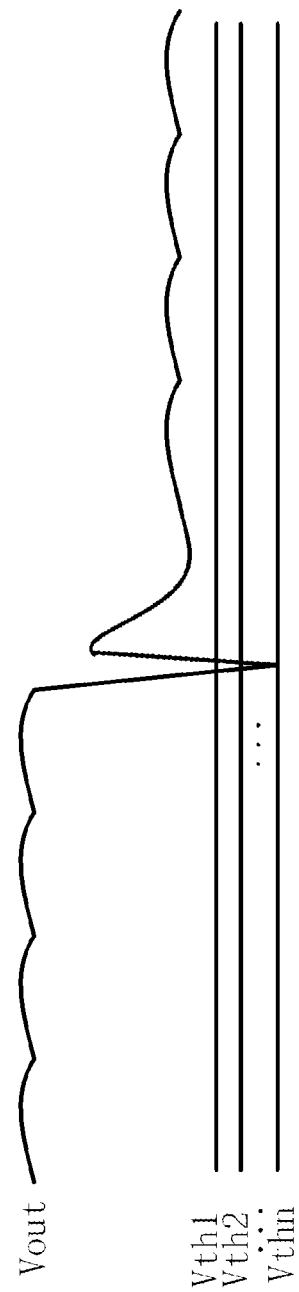
FIG. 3 is a waveform diagram of an abrupt change in the output voltage of the present disclosure.

With reference to FIG. 3, a waveform diagram of an abrupt change in the output voltage of the present disclosure is shown. When the output voltage Vout suddenly decreases (e.g., the output voltage Vout drops to the threshold voltage Vthn in the illustration), it usually indicates that the load current Iout increases sharply. By detecting a drop in the output voltage Vout, it is possible to detect whether a rapid rise in the load current Iout occurs. When the output voltage Vout suddenly decreases, the on time Ton may be increased from Ton_s to Ton_t. Further, the lower the output voltage Vout decreases, the longer the increased on time Ton_t is.

In other embodiments, the rapid change of load current may also be detected by the change amount of the first delay time Td_s between the falling edge of the PWM signal in the current phase and the rising edge of the PWM signal in the next phase. The first delay time Td_s will be changed in COT mode, when the rapid change of load current occurs. For example, the multi-phase controller 11 may detect the change of the first delay time Td_s in real time by a digital algorithm, such as counting a number of cycles during the first delay time Td_s. When the first delay time Td_s suddenly decreases, it means that the load current Iout increases sharply. When the output voltage Vout suddenly decreases, the on time Ton may be increased from Ton_s to Ton_t.

Furthermore, the multi-phase controller 11 can respectively compare the first delay time Td_s with a plurality of time thresholds so as to adjust the output PWM signal according to the maximum change amount of the first delay time Td_s (which can also be realized through a digital algorithm). The maximum change amount of the first delay time Td_s is a smallest time threshold value to which the first delay time Td_s decreases. When the multi-phase controller 11 determines that the rapid rise of the load current Iout occurs, the pulse width of the output PWM signal can be adjusted according to the maximum change amount of the first delay time Td_s. Specifically, the smaller the smallest time threshold to which the first delay time Td_s decreases, the larger the increased on time Ton_t is. When the multi-phase controller 11 determines that the rapid rise of the load current Iout occurs, the frequency of the output PWM signal can be adjusted according to the maximum change amount of the first delay time Td_s. Specifically, the lower the smallest time threshold to which the first delay time Td_s decreases, the higher the frequency of the output PWM signal is. Alternatively, the multi-phase controller 11 adjusts the pulse width of the output PWM signal and the frequency of the output PWM signal simultaneously according to the maximum change amount of the first delay time Td_s when it is determined that the rapid rise of the load current Iout occurs. That is, the on time and switching frequency are adjusted simultaneously to provide sufficient energy to the load.

In other embodiments, the load change may also be detected by the change amount of frequency of the PWM signal within the preset time. For example, the frequency change amount of the PWM signal within the preset time is detected in real time by the multi-phase controller 11, which can be realized by a digital algorithm. In one embodiment, the number of the rising edges of PWM signals of a certain phase within the preset time is counted, and when the number of the rising edges suddenly increases (i.e., the frequency increases), the load current Iout is sharply increased. Alternatively, the number of the rising edges of the PWM signals of all phases in the preset time is counted, and when the number of the rising edges suddenly increases (i.e., the frequency increases), the load current Iout is sharply increased. When the frequency of the PWM signal suddenly increases within a preset time, the on time Ton can be increased from Ton_s to Ton_t; the frequency of the PWM signal can be selectively increased; the on time and the switching frequency can be adjusted simultaneously.

According to the multi-phase power supply dynamic response control circuit, when the rapid change of load current is detected, the output PWM signal is adjusted to enter the second operation mode from the first operation mode. The on time of each phase corresponding to the COT mode in the steady state of the load current is increased, sufficient energy is provided for the load, and the output voltage can be prevented from decreasing.

Based on the same inventive concept, the disclosure also provides a multi-phase power supply dynamic response control method adopting the multi-phase power supply dynamic response control circuit.

Figure 4:
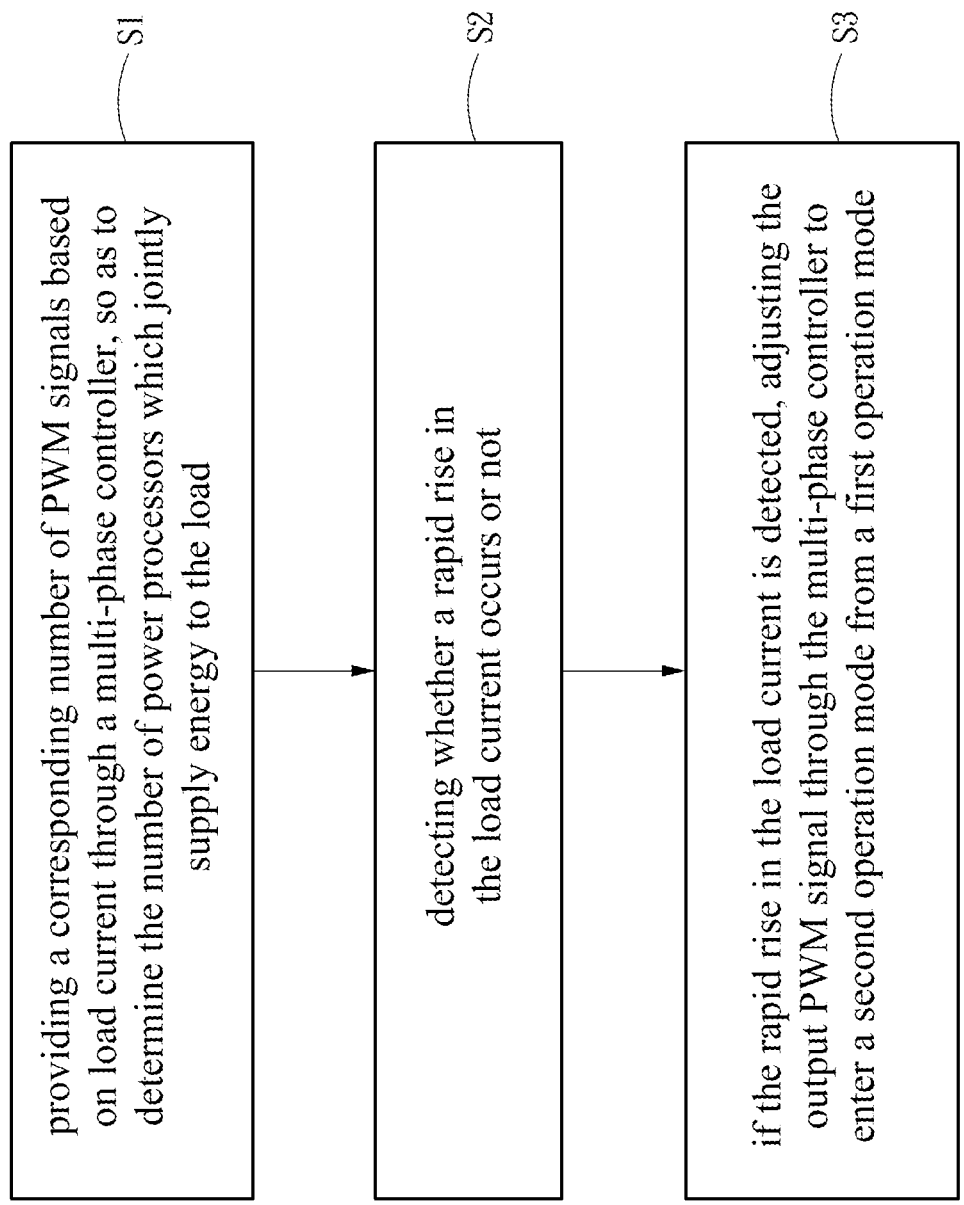
FIG. 4 is a flowchart of a multi-phase power supply dynamic response control method of the present disclosure.

With reference to FIG. 4, a flowchart of a multi-phase power supply dynamic response control method of the present disclosure is shown. The method comprises the following steps:

S1, providing a corresponding number of PWM signals based on load current through a multi-phase controller of a multi-phase power supply dynamic response control circuit, so as to determine the number of power processors which jointly supply energy to the load;

S2, detecting whether a rapid rise in the load current occurs or not; and

S3, if the rapid rise in the load current is detected, adjusting the output PWM signal through the multi-phase controller to enter a second operation mode from a first operation mode.

The multi-phase power supply dynamic response control method of the present disclosure will be further described with reference to the accompanying drawings.

With respect to step S1, through the multi-phase controller of the multi-phase power supply dynamic response control circuit, a corresponding number of PWM signals are provided based on the load current to determine the number of power processors that jointly provide power to the load. As shown in FIG. 1, the multi-phase controller 11 is configured to provide a corresponding number of PWM signals (PWM1-PWMn) based on the load current to control respective power processors 121-12n, respectively. The plurality of power processors 121-12n are connected in parallel between the multi-phase controller 11 and the load 19 to be conducted in response to respective PWM signals to jointly provide power to the load 19.

With respect to step S2, it is detected whether a rapid rise in the load current occurs. Whether the rapid rise of the load current Iout occurs or not can be detected by the decreasing of the real-time output voltage Vout of the circuit 10. Alternatively, whether the rapid rise of the load current Iout occurs or not can be detected by the change amount of frequency of one of the PWM signal in a preset time period. It is also possible to detect whether the rapid rise in the load current Iout occurs by detecting the change amount in the first delay time Td_s between the falling edge of the PWM signal in the current phase and the rising edge of the PWM signal in the next phase.

In one embodiment, the real-time output voltage Vout of the circuit can be compared with at least one threshold voltage Vth to generate at least one voltage comparison signal VCS, and whether the rapid rise in the load current Iout occurs is detected according to the voltage comparison signal VCS. Alternatively, the real-time output voltage Vout of the circuit is compared with a plurality of threshold voltages Vth1-Vthn respectively to generate a plurality of voltage comparison signals VCS1-VCSn, and whether the rapid rise in the load current occurs or not is further detected according to all the voltage comparison signals VCS1-VCSn.

With respect to step S3, if the rapid rise in load current is detected, the output PWM signal is adjusted by the multi-phase controller to enter the second operation mode from the first operation mode.

The first operation mode is a COT mode, and the second operation mode is a COT mode with increased on time. That is, the on time of the power processors 12i in the second operation mode is greater than the on time of the power processors 12i in the first operation mode. In the steady state of the load current Iout, the multi-phase controller 11 uses the COT mode to control the on time Ton_s of each of the power processors 121-12n supplying power to the load. The COT mode has fast dynamic response and good light load efficiency. Adopting COT mode, the on time Ton_s of each phase is fixed or approximately fixed when input voltage and output voltage are fixed. Here the term "approximately fixed" means that the on time may vary slightly, e.g. in the frequency jitter mode.

In a further embodiment, in the second operation mode, the pulse width of the PWM signal changes according to the change of the load 19. Specifically, the greater the increase amount of the load 19 is, the wider the pulse width of the PWM signal output by the multi-phase controller 11 is, so is the increased on time Ton_t of the corresponding power processors 121-12n longer. The increase of the on time Ton_s (i.e., the difference between Ton_t and Ton_s) provides sufficient energy to the load to prevent the output voltage from decreasing.

In a further embodiment, in the second operation mode, the frequency of the PWM signal (i.e. the switching frequency of the power processor) changes according to the change of the load 19. Alternatively, the pulse width of the output PWM signal and the frequency of the output PWM signal are simultaneously adjusted. That is, the on time and the switching frequency are adjusted simultaneously to provide sufficient energy to the load. It should be noted that if the rapid decrease in load current is detected, a reverse operation is performed. That is, the on time is reduced by reducing the pulse width of the output PWM signal, and/or the switching frequency is decreased by reducing the frequency of the output PWM signal.

In a further embodiment, after a preset period, the multi-phase controller 11 adjusts the output PWM signal to reenter the first operation mode (i.e. to the COT mode when the load current is at steady state). Specifically, each phase may be selected to temporarily increase the on time (i.e., to change Ton_s to Ton_t) for 1 or N cycles, typically N<=20. After N cycles have passed, the on time may return to the preset constant on time at the steady state (i.e., return from Ton_t to Ton_s).

In a further embodiment, the step of adjusting the output PWM signal by the multi-phase controller further comprises: adjusting the pulse width of the output PWM signal according to the maximum change amount of the output voltage; the maximum change amount of the output voltage being the difference amount between the real-time output voltage of the circuit when the load current is at the steady state and the minimum threshold voltage of the threshold voltages corresponding to all the voltage comparison signals. The multi-phase controller 11 further determines whether the rapid rise of the load current Iout occurs or not according to all the voltage comparison signals VCS1-VCSn. The multi-phase controller 11 adjusts the pulse width of the output PWM signal according to the maximum change amount Vva_max of the output voltage when it is detected that the rapid rise of the load current Iout occurs. Here, the maximum change amount Vva_max of the output voltage is the difference amount between the output voltage Vout_steady state of the circuit 10 when the load current Iout is at steady state and the minimum threshold voltage Vth_min to which the real-time output voltage Vout of the circuit 10 decreases, that is, Vva_max=Vout_steady−Vth_min. If the real-time output voltage Vout of the circuit 10 decreases to the threshold voltage Vthn (i.e. Vout=Vthn), the corresponding minimum threshold voltage Vth_min is the threshold voltage Vthn. If the real-time output voltage Vout of the circuit 10 decreases between the threshold voltage Vthi and the threshold voltage Vth (i+1) (i.e. Vth(i+1)>Vout>Vthi), the corresponding minimum threshold voltage Vth_min is the threshold voltage Vthi. For example, if the real-time output voltage Vout of the circuit 10 decreases to the threshold voltage Vth3 (i.e. Vout=Vth3), the corresponding minimum threshold voltage Vth_min is the threshold voltage Vth3. If the real-time output voltage Vout of the circuit 10 decreases between the threshold voltage Vth2 and the threshold voltage Vth3 (i.e. Vth3>Vout>Vth2), the corresponding minimum threshold voltage Vth_min is the threshold voltage Vth2. The voltage comparison signals VCS1-VCSn may be obtained in the manner described above and will not be repeated herein.

In a further embodiment, the method may further comprise: if the rapid rise in the load current is detected, adjusting the frequency of the output PWM signal according to the maximum change amount Vva_max of the output voltage. Specifically, the larger the maximum change amount Vva_max of the output voltage is, the higher the frequency of the output PWM signal is. Alternatively, if the rapid rise in the load current is detected, the pulse width of the output PWM signal and the frequency of the output PWM signal are simultaneously adjusted according to the maximum change amount Vva_max of the output voltage. That is, the on time and switching frequency are adjusted simultaneously to provide sufficient energy to the load.

In a further embodiment, the step of adjusting the output PWM signal by the multi-phase controller further comprises: respectively comparing the first delay time Td_s with a plurality of time thresholds so as to adjust an output PWM signal according to the maximum change amount of the first delay time Td_s, wherein the maximum change amount of the first delay time Td_s is a smallest time threshold value to which the first delay time Td_s decreases (which can also be realized through a digital algorithm) When it is detected that the rapid rise of the load current Iout occurs, the pulse width of the output PWM signal can be adjusted according to the maximum change amount of the first delay time Td_s. Specifically, the lower the smallest time threshold to which the first delay time Td_s decreases, the longer the on time Ton_t is.

In a further embodiment, the method may further comprise: if the rapid rise in the load current is detected, adjusting the frequency of the output PWM signal according to the maximum change amount of the first delay time Td_s. Specifically, the lower the smallest time threshold to which the first delay time Td_s decreases, the higher the frequency of the output PWM signal. Alternatively, if the rapid rise in the load current is detected, the pulse width of the output PWM signal and the frequency of the output PWM signal are simultaneously adjusted according to the smallest time threshold value to which the first delay time Td_s decreases. That is, the on time and switching frequency are adjusted simultaneously to provide sufficient energy to the load.

According to the multi-phase power supply dynamic response control method, when the rapid rise of the load current is detected, the output PWM signal is adjusted to enter the second operation mode from the first operation mode. The on time of each phase corresponding to the COT mode in the steady state is increased, sufficient energy is provided for the load, and the output voltage can be prevented from decreasing.

The foregoing is merely a preferred embodiment of the present disclosure, and it is noted that numerous modifications and adaptations made by those skilled in the art without departing from the principles of the present disclosure also fall within the scope of protection of the present disclosure.

What is claimed is:

1. A multi-phase power supply dynamic response control circuit, comprising:
   a multi-phase controller, configured to generate a plurality of pulse width modulation (PWM) signals based on a load current; and
   a plurality of power processors connected in parallel, coupled with the multi-phase controller and a load and configured to be conducted in response to a corresponding one of the PWM signals to jointly supply energy to the load,
   wherein the multi-phase controller is configured to adjust the plurality of PWM signals to enter a second operation mode from a first operation mode, if a rapid rise in the load current is detected.

2. The circuit according to claim 1, wherein in the second operation mode, a pulse width of at least one of the plurality of PWM signals is changed according to a change in the load current.

3. The circuit according to claim 1, wherein the first operation mode is a constant on time (COT) mode and the second operation mode is a COT mode with an increased on time.

4. The circuit according to claim 1, wherein the multi-phase controller is configured to adjust the plurality of PWM signals to reenter the first operation mode after a preset time period.

5. The circuit according to claim 1, further comprising:
an output voltage comparison unit, configured to compare a real-time output voltage of the circuit with at least one threshold voltage to generate at least one voltage comparison signal to be output to the multi-phase controller,
wherein the multi-phase controller is further configured to determine whether a rapid rise in the load current occurs or not according to the voltage comparison signal.

6. The circuit according to claim 5, wherein the output voltage comparison unit is further configured to compare the real-time output voltage of the circuit with a plurality of threshold voltages, respectively, to generate a plurality of voltage comparison signals to be output to the multi-phase controller;
the multi-phase controller is further configured to determine whether the rapid rise in the load current occurs or not according to all of the plurality of voltage comparison signals, and is configured to adjust the plurality of PWM signals according to a maximum change amount of the output voltage if the rapid rise in the load current occurs, wherein the maximum change amount of the output voltage is a difference between the output voltage of the circuit when the load current is at steady state and a minimum threshold voltage to which the real-time output voltage of the circuit decreases.

7. The circuit according to claim 1, wherein the multi-phase controller is further configured to detect whether the rapid rise in the load current occurs by detecting a change amount of a first delay time and/or by detecting a change amount of frequency of one of the PWM signals within a preset time period, wherein the first delay time is a time difference between a falling edge of the PWM signal at a current phase and a rising edge of the PWM signal at a next phase, and the change amount of frequency is a change amount of a number of the rising edges of the PWM signals at a same phase in the preset time period or a change amount of the number of the rising edges of the plurality of PWM signals at all phases within the preset time period.

8. The circuit according to claim 7, wherein the multi-phase controller is further configured to compare the first delay time with a plurality of time thresholds, respectively, to adjust the plurality of PWM signals according to a maximum change amount of the first delay time, wherein the maximum change amount of the first delay time is the smallest time threshold value to which the first delay time decreases.

9. A multi-phase power supply dynamic response control method, using the multi-phase power supply dynamic response control circuit according to claim 1, the method comprising the steps of:
providing the plurality of PWM signals based on the load current through multi-phase controller to determine the number of power processors which jointly supply energy to the load;
detecting whether a rapid rise in the load current occurs or not; and
if the rapid rise in the load current is detected, adjusting the plurality of PWM signals by the multi-phase controller to enter the second operation mode from the first operation mode.

10. The method according to claim 9, wherein the first operation mode is a COT mode and the second operation mode is a COT mode with an increased on time.

11. The method according to claim 9, wherein in the second operation mode, a pulse width of at least one of the plurality of PWM signals is changed according to a change in the load current.

12. The method according to claim 9, further comprising: adjusting the plurality of PWM signals by the multi-phase controller to reenter the first operation mode, after a preset time period.

13. The method according to claim 9, wherein the step of detecting whether the rapid rise in the load current occurs or not further comprises: comparing a real-time output voltage of the circuit with at least one threshold voltage to generate at least one voltage comparison signal, and further detecting whether the rapid rise in the load current occurs or not according to the at least one voltage comparison signal.

14. The method according to claim 9, wherein the step of detecting whether the rapid rise in the load current occurs or not further comprises: comparing a real-time output voltage of the circuit with a plurality of threshold voltages respectively to generate a plurality of voltage comparison signals, and further detecting whether the rapid rise in the load current occurs or not according to all the voltage comparison signals;
the step of adjusting the plurality of PWM signals by the multi-phase controller further comprises: adjusting the plurality of PWM signals according to a maximum change amount of the output voltage, wherein the maximum change amount of the output voltage is a difference between the output voltage of the circuit when the load current is at steady state and a minimum threshold voltage to which the real-time output voltage of the circuit decreases.

15. The method according to claim 9, wherein the step of detecting whether the rapid rise in the load current occurs or not further comprises: detecting whether the rapid rise in the load current occurs or not by detecting a change amount at a first delay time and/or detecting a change amount of frequency of one of the plurality of PWM signals in a preset time period through the multi-phase controller, wherein the first delay time is a time difference between a falling edge of the PWM signal at a current phase and a rising edge of the PWM signal at a next phase, and the change amount of frequency is a change amount of a number of the rising edges of the PWM signal at a same phase in the preset time period or a change amount of the number of the rising edges of the plurality of PWM signals at all phases within the preset time period.

16. The method according to claim 15, wherein the step of adjusting the plurality of PWM signal by the multi-phase controller further comprises: comparing the first delay time with a plurality of time thresholds, respectively, to adjust the plurality of PWM signals according to a maximum change amount of the first delay time, wherein a maximum change amount of the first delay time is the smallest time threshold value to which the first delay time decreases.

* * * * *